United States Patent
Lee et al.

(10) Patent No.: US 12,218,217 B2
(45) Date of Patent: Feb. 4, 2025

(54) LAYER STRUCTURE INCLUDING DIELECTRIC LAYER, METHODS OF MANUFACTURING THE LAYER STRUCTURE, AND ELECTRONIC DEVICE INCLUDING THE LAYER STRUCTURE

(71) Applicant: Samsung Electronics Co., Ltd., Suwon-si (KR)

(72) Inventors: Yunseong Lee, Osan-si (KR); Jinseong Heo, Seoul (KR); Taehwan Moon, Suwon-si (KR); Seunggeol Nam, Suwon-si (KR); Dukhyun Choe, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 17/545,442

(22) Filed: Dec. 8, 2021

(65) Prior Publication Data

US 2023/0009791 A1 Jan. 12, 2023

(30) Foreign Application Priority Data

Jul. 9, 2021 (KR) ........................ 10-2021-0090490

(51) Int. Cl.
*H01L 29/51* (2006.01)
*H10B 51/00* (2023.01)
*H10B 53/00* (2023.01)

(52) U.S. Cl.
CPC ........... *H01L 29/516* (2013.01); *H10B 51/00* (2023.02); *H10B 53/00* (2023.02)

(58) Field of Classification Search
CPC ............. H01L 29/516; H01L 29/40111; H01L 29/513; H01L 29/517; H01L 29/6684;
(Continued)

(56) References Cited

U.S. PATENT DOCUMENTS

| 10,854,707 B2 | 12/2020 | Yoo et al. |
| 11,393,846 B2 | 7/2022 | Yoo et al. |

(Continued)

FOREIGN PATENT DOCUMENTS

| KR | 10-2020-0071852 A | 6/2020 |
| KR | 10-2020-0084469 A | 7/2020 |

(Continued)

OTHER PUBLICATIONS

Jiang et al., "Jiang et al., A Closed Form Analytical Model of Back-Gated 2-D Semiconductor Negative Capacitance Field Effect Transistors," Journal of Electron Device Society, vol. 6, 2018; pp. 189-194. (Year: 2018).*

*Primary Examiner* — Julia Slutsker
(74) *Attorney, Agent, or Firm* — Harness, Dickey & Pierce, P.L.C.

(57) ABSTRACT

A layer structure including a dielectric layer, a method of manufacturing the layer structure, and an electronic device including the layer structure are disclosed. The layer structure including a lower layer, a dielectric layer, and an upper layer sequentially stacked. The dielectric layer includes sequentially stacked first, second, and third layers, wherein one of the first layer or the third layer is a ferroelectric, the other one is an anti-ferroelectric, and the second layer is an oxide layer. In one example, the dielectric layer may further include a fourth layer on the third layer.

26 Claims, 9 Drawing Sheets

(58) Field of Classification Search
CPC ... H01L 29/78391; H01L 28/56; H10B 51/00; H10B 53/00
See application file for complete search history.

(56) References Cited

U.S. PATENT DOCUMENTS

| | | | |
|---|---|---|---|
| 2015/0187900 A1* | 7/2015 | Shankar | H01L 27/088 257/411 |
| 2019/0393029 A1 | 12/2019 | Karbasian et al. | |
| 2020/0212168 A1* | 7/2020 | Yoo | H01L 29/78391 |
| 2021/0098595 A1 | 4/2021 | Lee et al. | |
| 2021/0359082 A1* | 11/2021 | Kang | H10B 53/30 |
| 2021/0359100 A1* | 11/2021 | Maeng | H10B 51/00 |
| 2021/0375890 A1* | 12/2021 | Chia | H01L 29/6684 |
| 2022/0052202 A1 | 2/2022 | Lee et al. | |

FOREIGN PATENT DOCUMENTS

| | | |
|---|---|---|
| KR | 10-2021-0010659 A | 1/2021 |
| KR | 10-2021-0017091 A | 2/2021 |

* cited by examiner

LAYER STRUCTURE INCLUDING DIELECTRIC LAYER, METHODS OF MANUFACTURING THE LAYER STRUCTURE, AND ELECTRONIC DEVICE INCLUDING THE LAYER STRUCTURE

CROSS-REFERENCE TO RELATED APPLICATION

This application is based on and claims priority under 35 U.S.C. § 119 to Korean Patent Application No. 10-2021-0090490, filed on Jul. 9, 2021, in the Korean Intellectual Property Office, the disclosure of which is incorporated by reference herein in its entirety.

BACKGROUND

1. Field

The present disclosure relates to layer structures, and more particularly, to layer structures including dielectric layers; methods of manufacturing the layer structures; and electronic devices including the layer structures.

2. Description of the Related Art

The durability of a ferroelectric film may weaken as the thickness of the ferroelectric film decreases. Accordingly, when down-scaling of an electronic device including, for example, an HZO (e.g., $Hf_xZr_yO_2$) ferroelectric film is performed, it is necessary to improve the electrical characteristics and secure reliability of the ferroelectric film. For example, since the polarization characteristics and durability characteristics of a dopant material used for manufacturing a ferroelectric thin film have an inverse relationship to each other. Accordingly, a ferroelectric thin film capable of securing the durability characteristics while maintaining the polarization characteristics is required. According to this requirement, a method of manufacturing a ferroelectric thin film, using a dopant that changes a crystal structure in a favorable direction, has been studied.

SUMMARY

Provided are layer structures including dielectric layers with improved durability.

Provided are methods of manufacturing the layer structures.

Provided are electronic devices including the layer structures.

Additional aspects will be set forth in part in the description, which follows and, in part, will be apparent from the description, or may be learned by practice of the presented embodiments of the disclosure.

According to an aspect of some example embodiments, a layer structure may include: a lower layer; an upper layer; and a dielectric layer between the lower layer and the upper layer. The dielectric layer may include a first layer; a second layer on the first layer, the second layer including an oxide layer; and a third layer on the second layer, wherein one of the first layer or the third layer is a ferroelectric and a remainder of the first and third layers is an anti-ferroelectric.

The dielectric layer may further include a fourth layer on the third layer.

A thickness of the second layer may be less than or equal to 10% of a total thickness of the dielectric layer.

The oxide layer may include an oxide having a band gap of 4 eV or more. An oxygen ratio of the oxide may be less than or equal to an oxygen ratio of $HfO_2$. At least one of the first layer or the third layer may have a thickness less than or equal to 50% of a total thickness of the dielectric layer. Each of the first layer and the third layer may have a thickness 10% or more of a total thickness of the dielectric layer.

At least one of the lower layer and the upper layer may include a semiconductor layer, a metal layer, or a two-dimensional material layer. The semiconductor layer may include at least one of a Si layer, a Ge layer, an oxide semiconductor layer, or a Group III-V compound semiconductor layer. The two-dimensional material layer may include at least one of a transition metal dichalcogenide layer, a quantum dot layer, or a carbon-based material layer. The third layer may be a ferroelectric and may include at least one of an HfO-based ferroelectric layer, a ZrO layer, or a perovskite layer. The HfO-based ferroelectric layer may include an $HfO_2$ layer or an HfO layer doped with a dopant. The dopant may include at least one of Si, Zr, Al, La, Y, Sr, Gd, or Mg. The first layer and the fourth layer each may include an $HfO_2$ layer. The oxide layer may include at least one of YO, LaO, MgO, SrO, BaO, or SiO. The second layer may be arranged between the third layer and the fourth layer.

According to an aspect of some example embodiments, a method of manufacturing a dielectric layer may include: forming a first layer on a substrate; forming a second layer on the first layer, the second layer including an oxide; and forming a third layer on the second layer. One of the first layer or the third layer may be a ferroelectric, and a remainder of the first and third layers may be an anti-ferroelectric. The method may further include forming a fourth layer on the third layer. A thickness of the second layer may have be 10% or less than a total thickness of the dielectric layer. The oxide may have a band gap of 4 eV or more. The substrate may include at least one of a metal layer, a Si layer, a Ge layer, an oxide semiconductor layer, a Group III-V compound semiconductor layer, a two-dimensional material layer, a transition metal dichalcogenide layer, a quantum dot layer, or a carbon-based material layer.

According to an aspect of some example embodiments, a transistor including: a first doped region; a second doped region separated from the first doped region; and a gate stack between the first and second doped regions, the gate stack including the dielectric layer having the layer structure according to some example embodiments and a gate electrode on the dielectric layer.

According to an aspect of an embodiment, a memory device including a transistor; and a data storage element connected to the transistor, the data storage element including the layer structure according to some example embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
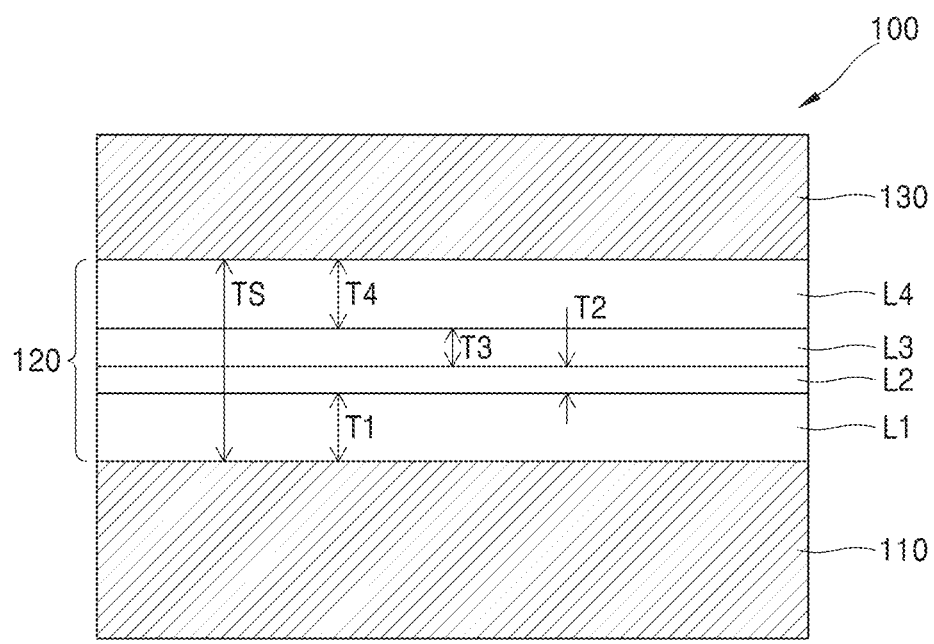
FIG. 1 is a cross-sectional view of a layer structure including a dielectric layer according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. Unless otherwise noted, like reference characters denote like elements throughout the attached drawings and written description, and thus descriptions will not be repeated.

Hereinafter, spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

Hereinafter, a layer structure including a dielectric layer, a method of manufacturing the same, and an electronic device including the layer structure according to some example embodiments will be described in detail with reference to the accompanying drawings. The manufacturing method will be described together in the process of explaining the layer structure. In the drawings, thicknesses of layers and regions may be exaggerated for clarification of the specification. The example embodiments of the inventive concepts are capable of various modifications and may be embodied in many different forms. Also, when an element or layer is referred to as being "on" or "above" another element or layer, the element or layer may be directly on another element or layer or intervening elements or layers.

FIG. 1 shows a first layer structure 100 including a dielectric layer 120 according to some example embodiments.

Referring to FIG. 1, the first layer structure 100 includes a lower layer 110, a dielectric layer 120, and an upper layer 130 sequentially stacked. As noted above, "the lower layer" and "the upper layer" are relative expressions. For example, depending on the position and/or viewpoint in which the first layer structure 100 is provided, the lower layer 110 may be an upper layer or a side layer. Similarly, depending on the position and/or viewpoint, the upper layer 130 may be a lower layer or a side layer. One surface (e.g., a bottom surface) of the dielectric layer 120 may be in direct contact with one surface (e.g., an upper surface) of the lower layer 110. Another surface (e.g., an upper surface) of the dielectric layer 120 may be in direct contact with one surface (e.g., a bottom surface) of the upper layer 130.

In some example embodiments, the lower layer 110 may be (and/or may include) a single layer or multiple layers, and the upper layer 130 may be (and/or may include) a single layer or multiple layers. In some example embodiments, the lower layer 110 and the upper layer 130 may not be dielectric layers. For example, in some example embodiments, the lower layer 110 may be (and/or may include) a material layer different from the dielectric layer 120; and/or in some example embodiments, the upper layer 130 may be (and/or may include) a material layer different from the dielectric layer 120.

In some example embodiments, the surface of the lower layer 110 in contact with the dielectric layer 120 may be a material layer different from the dielectric layer 120. In some example embodiments, the surface of the upper layer 130 in contact with the dielectric layer 120 may be a material layer different from the dielectric layer 120. In some example embodiments, the material layer different from the dielectric layer 120 may be (and/or may include) a material layer with different dielectric properties, a semiconductor layer, and/or a conductor layer.

For example, in some example embodiments, the lower layer 110 (and/or the upper layer 130) may be (and/or may include) material layers that do not have a dielectric property (e.g., polarization property) comparable to that of the dielectric layer 120. In some example embodiments, the lower layer 110 may include a semiconductor layer and/or a conductor layer. For example, the lower layer 110 (and/or the upper layer 130) may include at least one of a silicon (Si) layer, a germanium (Ge) layer, an oxide semiconductor layer (e.g., a indium gallium zirconium oxide (IGZO) layer, and/or the like), a Group III-V compound semiconductor layer, a two-dimensional (2D) material layer (e.g., a graphene layer, a $HfS_2$ layer, and/or the like), a transition metal dichalcogenide (TMD) layer, a quantum dot layer (e.g., a colloidal QD, a nanocrystal-based material layer, and/or the like), a carbon-based material layer (e.g., a graphene layer, a nanotube (CNT) layer, and/or the like), and/or the like. In some example embodiments, the material of the upper layer 130 may be the same as that of the lower layer 110.

In some example embodiments, the dielectric layer 120 may include a plurality of layers (e.g., a first layer L1, a second layer L2, a third layer L3, and a fourth layer L4) sequentially stacked. For example, the first layer L1 is formed on the lower layer 110. The second layer L2 may be formed on the first layer L1 and may be in direct contact with the first layer L1. The third layer L3 may be formed on the second layer L2 and may be in direct contact with the second layer L2. The fourth layer L4 may be formed on the third layer L3 and may be in direct contact with the third layer L3.

However, the example embodiments are not limited thereto, and, for example, in some example embodiments, the second layer L2 may be arranged between the third layer L3 and the fourth layer L4. The upper layer 130 may be formed on the fourth layer L4. The thickness TS of the dielectric layer 120 may be, for example, 20 nm or less, 10 nm or less, and/or 5 nm or less. In some example embodiments, the dielectric layer 120 may be a ferroelectric layer. For example, the dielectric layer 120 may have bulk ferroelectric properties.

In some example embodiments, the first layer L1 may be a hafnium oxide ("HfO") based ferroelectric layer. For example, the first layer L1 may be (and/or include) an $HfO_2$ layer. Also, in some example embodiments, the first layer L1 may include at least one of a ZrO layer, an HfO layer with a dopant, and/or a perovskite layer. In some example embodiments, the dopant may be at least one of Si, Zr, Al, La, Y, Sr, Gd, and/or Mg. In some example embodiments, the perovskite layer may include at least one of Pb(Zr,Ti)O, PbTiO, BaTiO, SrBiTaO, BiFeO, LiNbO, PVDF, AlScN, and/or KNbO.

In some example embodiments, the second layer L2 may be an oxide layer, but is not limited thereto. In some example embodiments, an oxidation state of the second layer L2 may be less than or equal to that of $HfO_2$. For example, an oxygen ratio included in an oxide of the second layer L2 may be less than or equal to that of $HfO_2$. For example, the second layer L2 may include at least one of a YO layer, a LaO layer, an MgO layer, an SrO layer, a BaO layer, and/or an SiO layer. In some example embodiments, the second layer L2 may include a material layer having a band gap of a first value. In some example embodiments, the first value may be 4 eV or more, but is not limited thereto. The second layer L2 may affect an internal bias of the dielectric layer 120. Accordingly, the second layer L2 may be one of factor enabling the dielectric layer 120 to maintain ferroelectricity and reliability, even in an environment in which the thickness of the dielectric layer 120 is reduced.

In some example embodiments, the second layer L2 may have a second thickness T2. The second thickness T2 may be 10% or less of the total thickness TS of the dielectric layer 120. The second layer L2 may perform function to normally maintain electrical characteristics (e.g., leakage current characteristics) of the dielectric layer 120. For example, due to the second layer L2, the increase in a leakage current (e.g., due to a decrease in the thickness of the dielectric layer 120) may be mitigated and/or prevented.

In some example embodiments, the third layer L3 may be a ferroelectric layer. The third layer L3 has a third thickness T3. The third thickness T3 may be greater than the second thickness T2 of the second layer L2. For example, the thickness T3 of the third layer L3 may be 60% or less of the total thickness TS of the dielectric layer 120. For example, the thickness T3 of the third layer L3 may be 10% or more and/or 50% or less the total thickness TS. The third layer L3 may be a layer performing at least a function to normally maintain the ferroelectric polarization characteristic of the dielectric layer 120. In some example embodiments, the third layer L3 may include a HZO (e.g., $Hf_xZr_yO_2$) layer.

In some example embodiments, the fourth layer L4 may be a ferroelectric layer. In some example embodiments, the fourth layer L4 may include one of the material layers used as (and/or in) the first layer L1. The thickness T1 of the first layer L1 and the thickness T4 of the fourth layer L4 respectively may be 10% or more and/or 50% or less of the thickness TS of the dielectric layer 120.

Next, reviewing a manufacturing method, the first to fourth layers L1, L2, L3, and L4 may be formed on the lower layer 110, and the upper layer 130 may be formed on the fourth layer L4. The first to fourth layers L1, L2, L3, and L4 may be formed in various stacking methods. For example, the first to fourth layers L1, L2, L3, and L4 may be sequentially formed using an atomic layer deposition (ALD) method. Taking the third layer L3, as an example, after forming an Hf layer on the second layer L2 (e.g., by supplying an Hf precursor to a chamber), a purge operation is performed to remove remaining residual materials, and the Hf layer is oxidized by injecting an oxidizing agent. Then, a layer is formed by supplying a Zr precursor to the chamber. Afterwards, a purge operation may be performed to remove the remaining materials, and the layer may be oxidized by injecting an oxidizing agent. After the Zr layer is formed on the Hf layer, a purge operation (e.g., for removing residual gas remaining in the chamber) may be performed. The atomic layer deposition process of the first, second, and fourth layers L1, L2, and L4 may also be performed along with the deposition process of the third layer L3. After depositing the first to fourth layers L1, L2, L3, and L4 (e.g., using an atomic layer deposition method) a heat treatment process may be performed. By controlling the heat treatment process, the first and fourth layers L1 and L4 may be ferroelectric layers and/or antiferroelectric layers. In the latter case, the dielectric layer 120 may be a layer in which a ferroelectric layer and an antiferroelectric layer are mixed.

Because the dielectric layer 120 includes the third layer L3 (which stably maintains the ferroelectric polarization characteristic) and the second layer L2 (which stably maintains the leakage current characteristic) the dielectric layer 120 may maintain durability as a ferroelectric layer even when the thickness of the ferroelectric layer is reduced to 20 nm or less, and/or to 10 nm or less.

Figure 2:
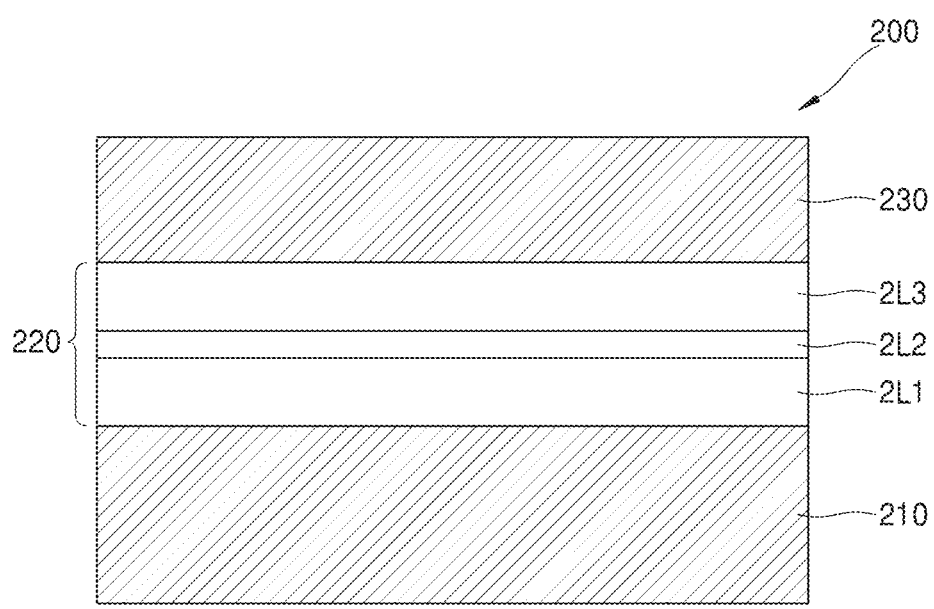
FIG. 2 is a cross-sectional view of a layer structure including a dielectric layer according to some example embodiments.

FIG. 2 shows a second layer structure 200 according to some example embodiments.

Referring to FIG. 2, the second layer structure 200 includes a lower layer 210, a dielectric layer 220, and an upper layer 230 sequentially stacked. In one example, the stacking relationship of the lower layer 210, the dielectric layer 220, and the upper layer 230 may be the same as the stacking relationship of the lower layer 110, the dielectric layer 120, and the upper layer 130 of the first layer structure 100 of FIG. 1.

In some example embodiments, the lower layer 210 and/or the upper layer 230 may be, respectively, the same as the lower layer 110 and/or the upper layer 130 of FIG. 1, but the example embodiments are not limited thereto, and the lower layer 210 and/or the upper layer 230 may be different the lower layer 110 and/or the upper layer 130.

The dielectric layer 220 includes a first layer 2L1, a second layer 2L2, and a third layer 2L3 sequentially stacked. In some example embodiments, the total thickness of the dielectric layer 220 may be 20 nm or less (for example, 10 nm or less and/or 5 nm or less).

The first layer 2L1 may be on one surface (e.g., an upper surface) of the lower layer 210 and may be in direct contact with the lower layer 210. The second layer 2L2 may be on the first layer 2L1 and may be in direct contact with the first layer 2L1. The third layer 2L3 may also be on the second layer 2L2 and may be in direct contact with the second layer 2L2. The upper layer 230 may be on the third layer 2L3, and one surface (e.g., a bottom surface) of the upper layer 230 may directly contact one surface (e.g., an upper surface) of the third layer 2L3.

At least one of the first and third layers 2L1 and 2L3 may be ferroelectric layers. Accordingly, the dielectric layer 220 may have a ferroelectric property. For example, the dielectric layer 220 may be considered a ferroelectric layer. In some example embodiments, one of the first and third layers 2L1 and 2L3 may be a layer exhibiting ferroelectric property (e.g., polarization property) of the dielectric layer 220. The material of the first layer 2L1 and the material of the third layer 2L3 may be the same as or different from each other.

The second layer 2L2 may be a layer configured to maintain the electrical characteristics of the dielectric layer 220. For example, the second layer 2L2 may be a layer performing function to mitigate and/or prevent an increase in leakage current of the dielectric layer 220 when the thickness of the dielectric layer 220 is reduced. At least one of the first and third layers 2L1 and 2L3 may include a material layer used as the first layer L1 of the first layer structure 100 of FIG. 1. For example, in some example embodiments, the first layer 2L1 may be an HfO-based ferroelectric layer (e.g., an HfO layer and/or an HZO layer). In some example embodiments, the third layer 2L3 may be a layer exhibiting ferroelectric properties of the dielectric layer 220 and may include, for example, an HZO layer.

In the dielectric layer 220, the thickness of the first layer 2L1 and the thickness of the third layer 2L3 may be the same as or different from each other. For example, the thickness of the first layer 2L1 may be greater than that of the third layer 2L3, or vice versa. In one example, the thicknesses of the first layer 2L1 and the third layer 2L3, respectively, may be 10% or more and/or 50% or less of the total thickness of the dielectric layer 220. The second layer 2L2 may have a thickness less than that of the first and third layers 2L1 and 2L3. For example, the thickness of the second layer 2L2 may be 10% or less of the total thickness of the dielectric layer 220.

The manufacturing of the second layer structure 200 may follow a similar manufacturing process as the process for the first layer structure 100. For example, the dielectric layer 220 may be formed using an atomic layer deposition method, and may be formed according to the manufacturing method of the dielectric layer 120 of FIG. 1. One of the first and third layers 2L1 and 2L3 may be an antiferroelectric layer according to heat treatment in the manufacturing process of the dielectric layer 220. In this case, the dielectric layer 220 includes a ferroelectric layer and an antiferroelectric layer.

Figure 3:
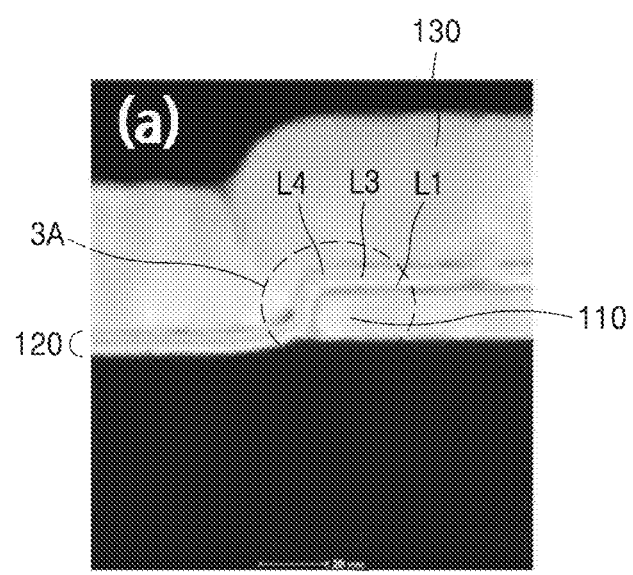
FIGS. 3 and 4 are transmission electron micrographs (TEM) showing a layer structure including a dielectric layer according to some example embodiments.
Figure 4:
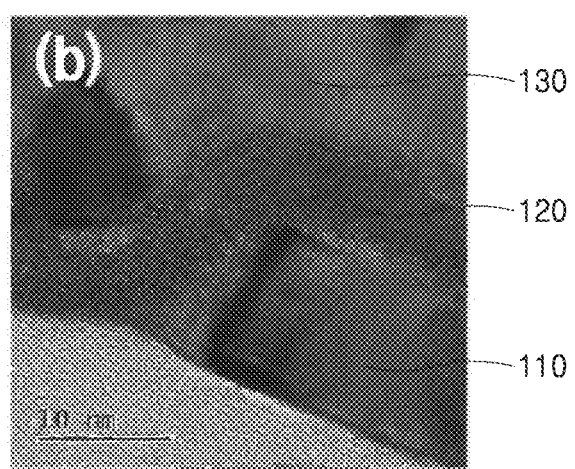

FIG. 3 shows a transmission electron micrograph (TEM) of an example first layer structure 100. FIG. 4 is an enlarged photograph of a first area 3A of FIG. 3. In the first layer structure 100 used to obtain the picture of FIG. 3, the lower layer 110 was formed with a layer containing silicon (Si), and the upper layer 130 was formed with a layer containing molybdenum (Mo). Also, the first layer L1 of the dielectric layer 120 is formed with an HfO layer, the second layer L2 is formed with a YO layer, the third layer L3 is formed with an HZO layer, and the fourth layer L4 is formed with an HfO layer, respectively.

Referring to FIG. 3, the dielectric layer 120 and the upper layer 130 are sequentially stacked on the lower layer 110. In FIG. 3, only the first layer L1, the third layer L3, and the fourth layer L4 of the dielectric layer 120 are seen, and the second layer L2 is not seen. This is because the thickness of the second layer L2 is as thin as 5 nm or less; however, the second layer L2 may be seen in an image using an energy dispersive spectrometer (EDS), as shown in FIG. 5.

Figure 5:
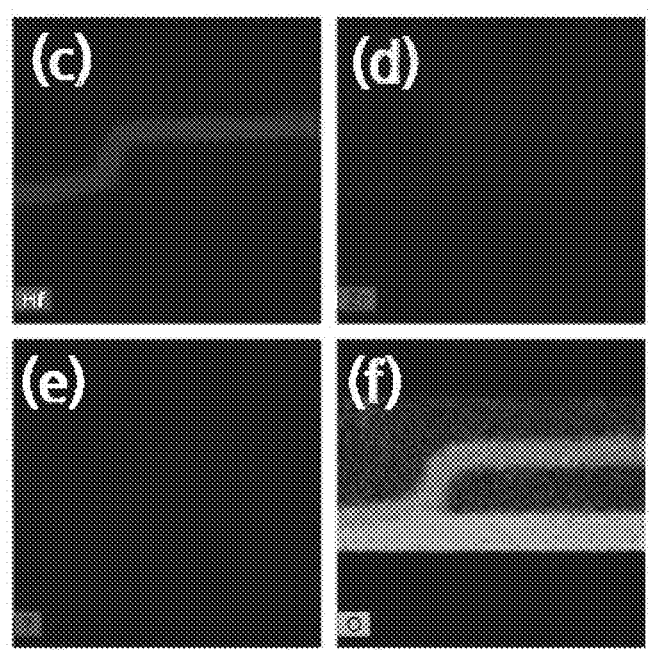
FIG. 5 is an image of a layer structure including a dielectric layer according to some example embodiments, measured by using an Energy Dispersive Spectrometer (EDS)

FIG. 5 shows an image taken by using energy dispersive spectroscopy (EDS) for the first layer structure 100.

In FIG. 5, an image (c) shows a layer including hafnium (Hf), and shows a first layer L1, a third layer L3, and a fourth layer L4 including Hf. In FIG. 5, an image (d) shows a layer including zirconium (Zr), and shows the third layer L3 including HZO. In FIG. 5, an image (e) shows a layer including yttrium (Y), and shows a second layer L2 including yttrium oxide (YO). In FIG. 5, in the image (e), an image including Y is too faint, so a dashed line is used for identification. In FIG. 5, an image (f) shows a layer including oxygen (O), and the image (f) may be viewed as an image representing an outline of the dielectric layer 120 since the first to fourth layers L1 to L4 all include oxygen.

FIGS. 6 to 9 show results of measuring the ferroelectric properties of the dielectric layer 120 of the first layer structure 100. For the above measurement, the first layer structure 100 was used to obtain the results of FIGS. 3 and 5.

Figure 6:
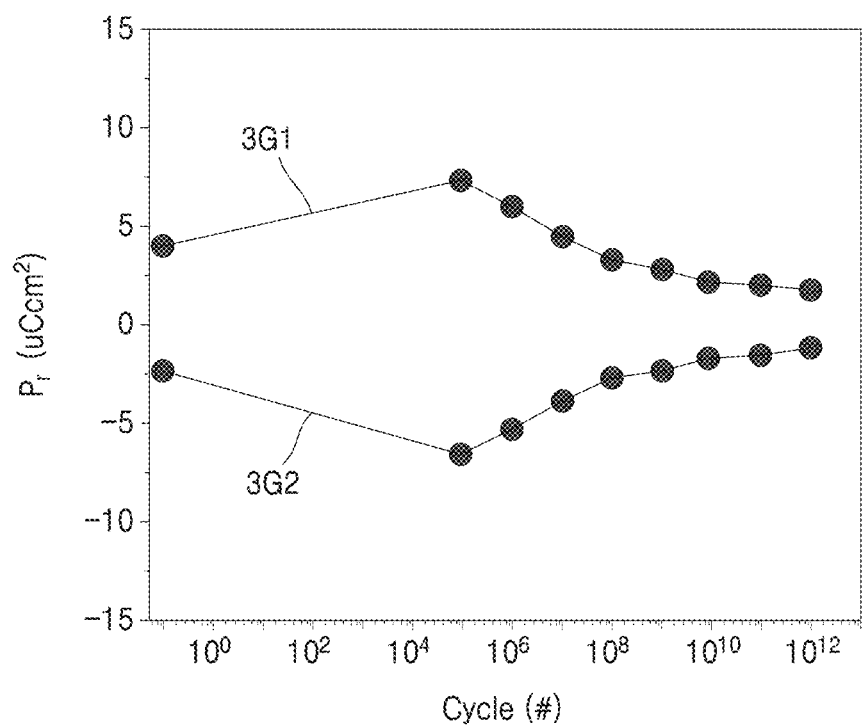
FIGS. 6 to 9 are graphs showing ferroelectric properties of a layer structure including a dielectric layer according to some example embodiments.

FIG. 6 shows the polarization characteristics of the dielectric layer 120 of the first layer structure 100, and shows the result of measuring the polarization by repeating 1E12 ($10^{12}$) times with 3 MV. In FIG. 6, the horizontal axis indicates the number of measurements, and the vertical axis indicates the polarization (Pr). In FIG. 6, a first graph 3G1 indicates a positive polarization change during the above repetition, and a second graph 3G2 indicates a negative polarization change during the repeated measurements. The first and second graphs 3G1 and 3G2 suggest that the polarization characteristic is clearly maintained until 1E12 measurements.

FIG. 6 also suggests that the dielectric layer 120 of the first layer structure 100 is a ferroelectric. In the case of a conventional ferroelectric thin film including HZO, considering that the polarization characteristic is generally maintained up to 1E7 times, the results of FIG. 6 suggest that the dielectric layer 120 having the layer structure according to the example embodiments may be used 1E5 or more times greater than the conventional ferroelectric thin film. The result also suggests that the durability and reliability of the dielectric layer 120 of the layer structure 100 is greater than that of the conventional ferroelectric thin film.

Figure 7:
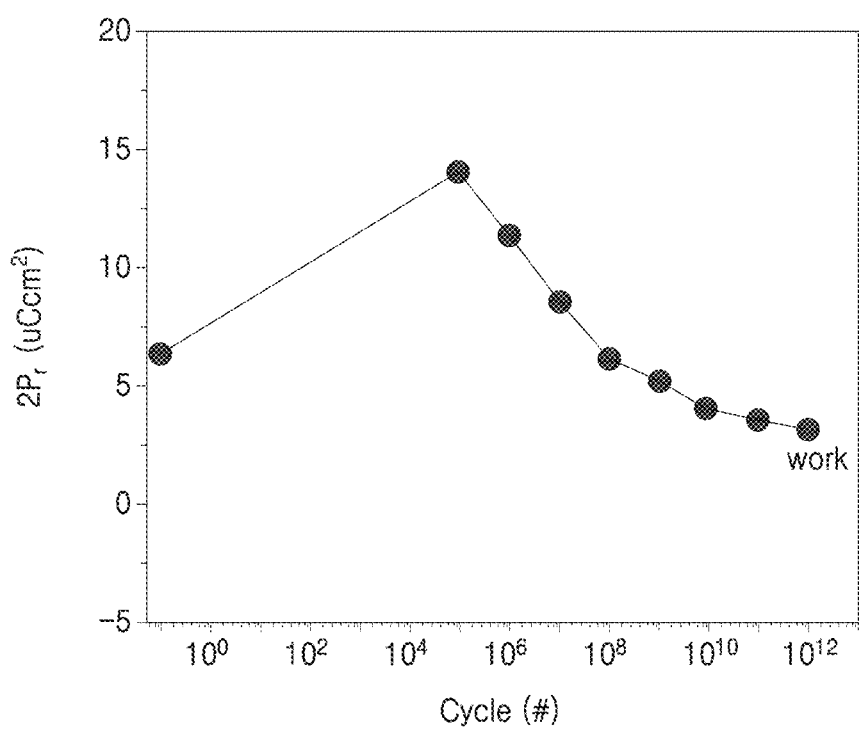

In FIG. 7, the horizontal axis indicates the number of polarization measurements, and the vertical axis indicates 2Pr. FIG. 7 shows a result of adding an absolute value of a negative polarization value to an absolute value of a positive polarization value in the polarization characteristic of FIG. 6.

Referring to FIG. 7, it may be seen that the polarization characteristic is clearly maintained until 1E12 measurements are taken.

Figure 8:
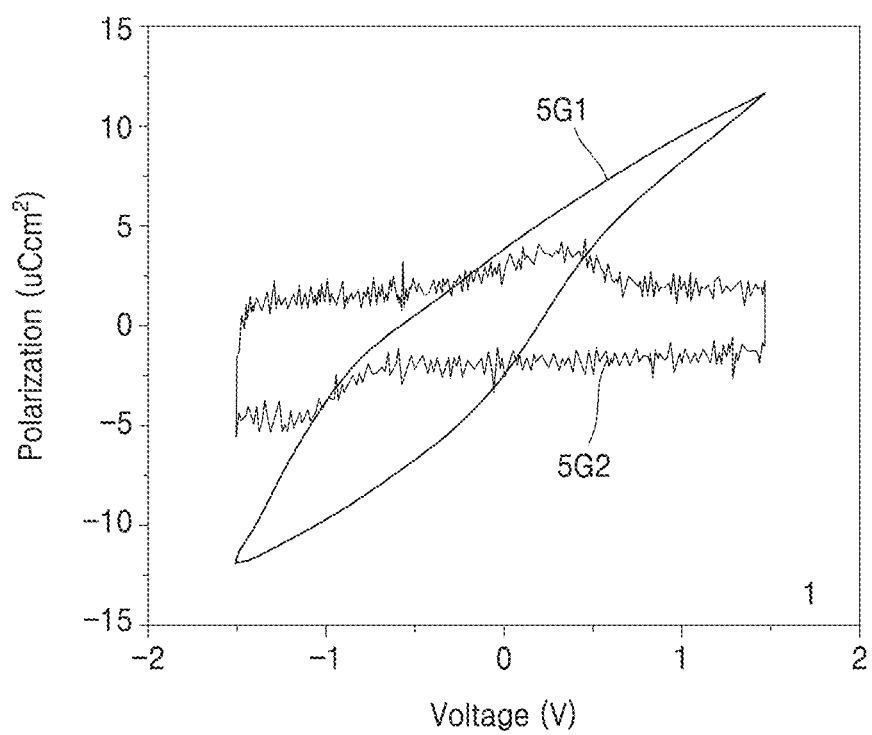

FIG. 8 shows a polarization-voltage characteristic confirmed in the first measurement of the polarization measurement of FIG. 6.

Referring to FIG. 8, the hysteresis characteristic 5G1 corresponds to a hysteresis characteristic appearing in a ferroelectric. The hysteresis characteristic 5G1 and the current-voltage characteristic 5G2 of FIG. 8 suggest that the dielectric layer 120 of the first layer structure 100 has a switching characteristic.

Figure 9:
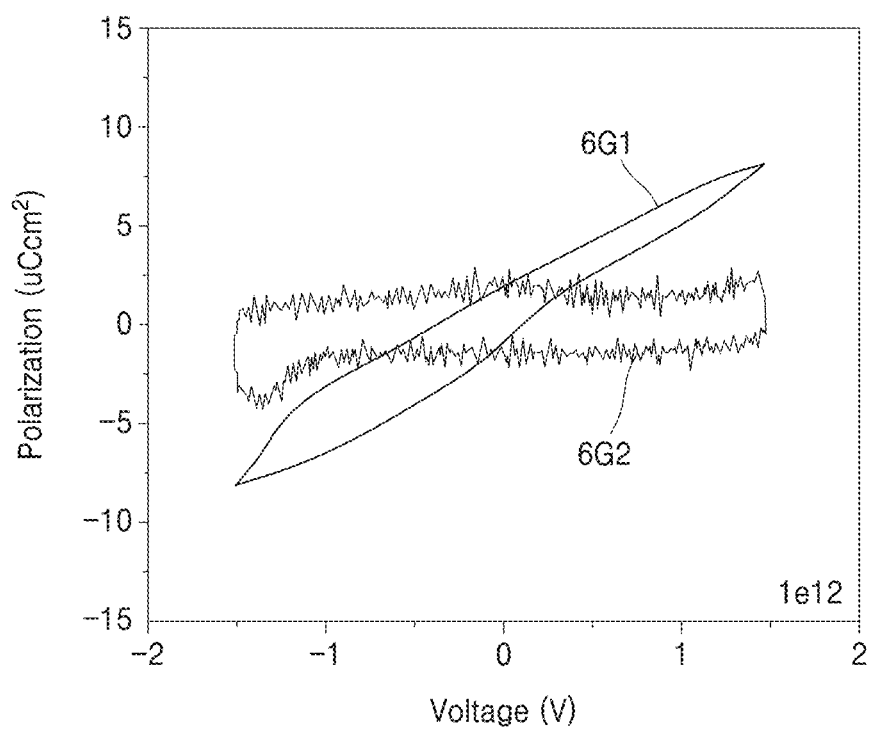

FIG. 9 shows a polarization-voltage characteristic 6G1 and a current-voltage characteristic 6G2 measured after the polarization measurement of FIG. 6 is performed 1E12 times.

Referring to FIG. 9, it may be seen that the polarization characteristics and switching characteristics are maintained even after 1E12 polarization measurements are performed.

Like the first layer structure 100, the second layer structure 200 includes a layer 2L1 or 2L3 exhibiting ferroelectric properties and a layer 2L2 preventing an increase in leakage current. Accordingly, the second layer structure 200 may also have the polarization-voltage characteristic and the current-voltage characteristic of FIGS. 6 to 9.

Figure 10:
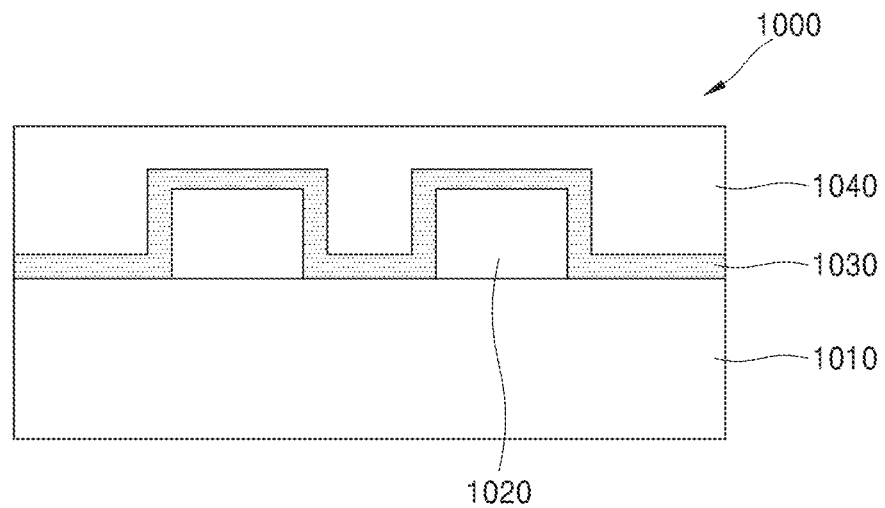
FIG. 10 is a cross-sectional view illustrating a case in which a dielectric layer is formed on a non-planar lower layer in a layer structure including a dielectric layer according to some example embodiments.

FIG. 10 shows a third layer structure 1000 including a dielectric layer according to some example embodiments.

Referring to FIG. 10, the third layer structure 1000 may include a substrate 1010, a first material layer 1020 on a partial region of the substrate 1010, a dielectric layer 1030 on the first material layer 1020, and a second material layer 1040 on the dielectric layer 1030. The substrate 1010 and the first material layer 1020 may include the same material and/or different materials. The material of the substrate 1010 may be the same as or different from the material of the lower layer 110 of the first layer structure 100. The material of the first material layer 1020 may be the same as or different from the material of the lower layer 110 of the first layer structure 100. The first material layer 1020 may be a wiring layer or an electrode layer. The first material layer 1020 may have a quadrangular cross-section. One first material layer 1020 may be present on the substrate 1010, and/or a plurality of first material layers 1020 separated from each other may be present.

The dielectric layer 1030 may directly contact the first material layer 1020, and may cover side surfaces and upper surfaces of the first material layer 1020. Because the first material layer 1020 having a step difference is present on the substrate 1010, the dielectric layer 1030 is provided on a non-flat surface (e.g., an uneven surface). The dielectric layer 1030 covers the first material layer 1020 and extends onto the substrate 1010. The dielectric layer 1030 may be the dielectric layer 120 of the first layer structure 100 or the dielectric layer 220 of the second layer structure 200. Because the dielectric layer 1030 covers the first material layer 1020 having a step difference, an upper surface of the dielectric layer 1030 is also not flat.

The second material layer 1040 may be provided to cover the entire upper surface of the dielectric layer 1030. In some example embodiments, the second material layer 1040 may cover only a partial region of the dielectric layer 1030. In some example embodiments, the second material layer 1040 may be a wiring layer and/or an electrode layer. In some example embodiments, a surface of the second material layer 1040 may be flat, and/or may be not flat. The material of the second material layer 1040 may be the same as or different from that of the substrate 1010 and/or the first material layer 1020.

Figure 11:
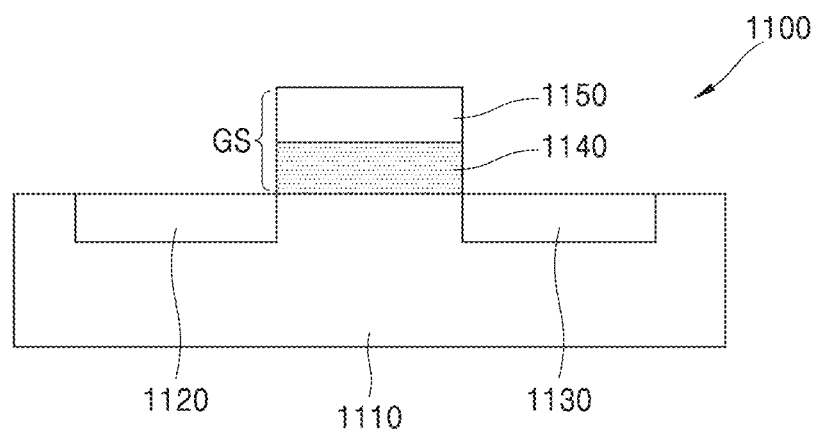
FIG. 11 is a cross-sectional view illustrating a transistor as an electronic device including a layer structure including a dielectric layer according to some example embodiments.

FIG. 11 shows a ferroelectric field effect transistor (FeFET) 1100 an example of one of the semiconductor devices including a layer structure according to some example embodiments.

Referring to FIG. 11, the ferroelectric transistor 1100 includes a substrate 1110, first and second doped regions 1120 and 1130 formed on the substrate 1110 and separated from each other, and a gate stack GS on the substrate 1110 between the first and second doped regions 1120 and 1130. The gate stack GS may include a ferroelectric layer 1140 and a gate electrode layer 1150 sequentially stacked, but is not limited thereto. The ferroelectric layer 1140 may include the dielectric layer 120 of the first layer structure 100 and/or the dielectric layer 220 of the second layer structure 200. The substrate 1110 may include a semiconductor layer. One of the first and second doped regions 1120 and 1130 may be a source region, and the other may be a drain region. A region of the substrate 1110, e.g., between the source and drain regions, may form a channel region.

Figure 12:
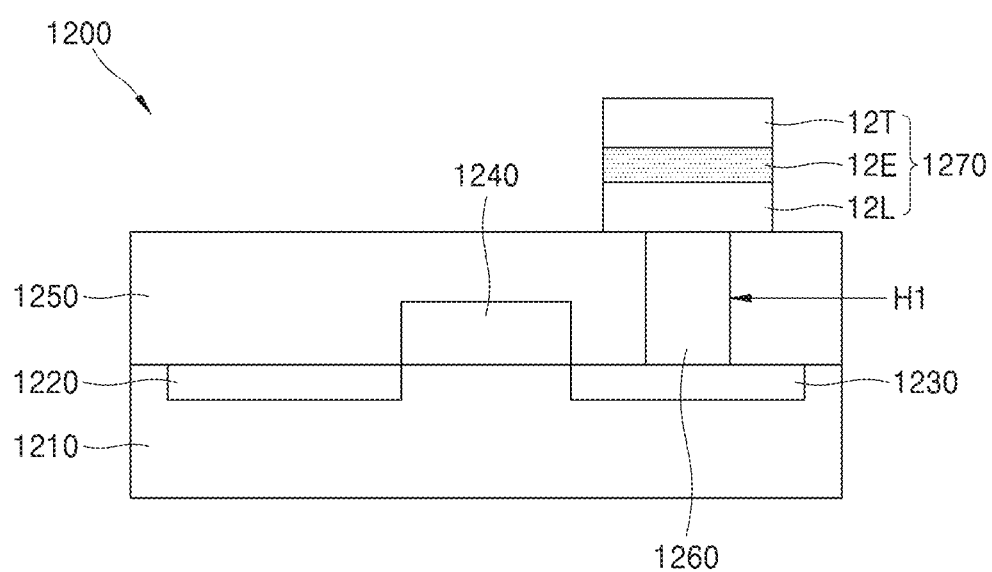
FIG. 12 is a cross-sectional view illustrating an electronic device having a layer structure including a dielectric layer according to some example embodiments, and showing a memory device.

FIG. 12 shows a memory device 1200 including a layer structure according to some example embodiments. The memory device 1200 may be, e.g., a nonvolatile ferroelectric memory device (e.g., FRAM).

Referring to FIG. 12, the memory device 1200 may include a substrate 1210, first and second doped regions 1220 and 1230 formed in the substrate 1210, a gate stack 1240, a conductive plug 1260, and data storage element 1270, and an interlayer insulating layer 1250. The substrate 1210 may include a semiconductor substrate. The first and second doped regions 1220 and 1230 are separated from each other. The first and second doped regions 1220 and 1230 may be formed by doping a P-type or N-type conductive impurity in predetermined (or otherwise determined) regions of the substrate 1210. The type of the conductive impurity doped in the first and second doped regions 1220 and 1230 may be opposite to the type of conductive impurity doped in the substrate 1210. For example, when the substrate 1210 is a P-type semiconductor substrate, the first and second doped regions 1220 and 1230 may be regions doped with an N-type conductive impurity. One of the first and second doped regions 1220 and 1230 may be a source region, and the other may be a drain region.

The gate stack 1240 is formed on the substrate 1210 between the first doped region 1220 and the second doped region 1230. The gate stack 1240 may include a gate insulating layer and a gate electrode sequentially stacked. The gate stack 1240 and the first and second doped regions 1220 and 1230 may form a transistor.

The interlayer insulating layer 1250 is formed to cover the transistor. An upper surface of the interlayer insulating layer 1250 may be flat. In one example, the interlayer insulating layer 1250 may include a silicon oxide layer, but is not limited thereto. A via hole H1 through which the second doped region 1230 is exposed is formed in the interlayer insulating layer 1250. The via hole H1 may be located on the second doped region 1230. The conductive plug 1260 may be included in the via hole H1. For example, the via hole H1 may be completely filled with the conductive plug 1260. One surface (e.g., a bottom surface) of the conductive plug 1260 is in direct contact with the second doped region 1230.

The data storage element 1270 is provided on the interlayer insulating layer 1250 and to cover the via hole H1 and the conductive plug 1260. The data storage element 1270 may be in direct contact with the conductive plug 1260. The data storage element 1270 may include a lower electrode 12L, a ferroelectric layer 12E, and an upper electrode 12T. In some example embodiments, the data storage element 1270 may be a capacitor. The data storage element 1270, including the sequentially stacked lower electrode 12L, the ferroelectric layer 12E, and the upper electrode 12T, may be the first layer structure 100 of FIG. 1 and/or the second layer structure 200 of FIG. 2. Alternatively, the ferroelectric layer 12E may include the dielectric layer 120 of the first layer structure 100 or the dielectric layer 220 of the second layer structure 200. In some example embodiments, the gate insulating layer may include the dielectric layer 120 of the first layer structure 100 or the dielectric layer 220 of the second layer structure 200.

However, the memory device 1200 is not limited thereto. For example, in some embodiments, the data storage element 1210 may be directly connected to the transistor and/or the data storage element 1210 may share an doped region (e.g., the second doped region 1230)

In a layer structure including the disclosed dielectric layer, the dielectric layer separately includes a layer exhibiting ferroelectric properties and a layer capable of normally maintaining electrical properties (e.g., leakage current properties). Accordingly, even in an environment in which the thickness of the dielectric layer is reduced, the dielectric layer may prevent an increase in leakage current while maintaining the ferroelectric properties (polarization properties).

In addition, in the characteristic measurement test, the characteristic is maintained until the number of measurements exceeds 1E12, and the number of measurements 1E12 is 1E5 times greater than the number of measurements for a conventional ferroelectric film.

As a result, when the disclosed dielectric layer is used, durability may be improved while ensuring reliability as a ferroelectric even in an environment in which the thickness is reduced.

It should be understood that some example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A layer structure comprising:
   a lower layer;
   an upper layer; and
   a dielectric layer between the lower layer and the upper layer, the dielectric layer comprising
      a first layer,
      a second layer on the first layer, the second layer including an oxide layer, and
      a third layer on the second layer,
   wherein one of the first layer or the third layer is a ferroelectric and a remainder of the first and third layers is an anti-ferroelectric,
   wherein the oxide layer directly contacts the ferroelectric and the anti-ferroelectric, and
   wherein each of the first layer and the third layer is a single layer.

2. The layer structure of claim 1, wherein the dielectric layer further includes a fourth layer on the third layer.

3. The layer structure of claim 1, wherein a thickness of the second layer is less than or equal to 10% of a total thickness of the dielectric layer.

4. The layer structure of claim 1, wherein the oxide layer includes an oxide having a band gap of 4 eV or more.

5. The layer structure of claim 4, wherein an oxygen ratio of the oxide is less than or equal to an oxygen ratio of $HfO_2$.

6. The layer structure of claim 1, wherein at least one of the first layer or the third layer has a thickness less than or equal to 50% of a total thickness of the dielectric layer.

7. The layer structure of claim 1, wherein each of the first layer and the third layer has a thickness 10% or more of a total thickness of the dielectric layer.

8. The layer structure of claim 1, wherein at least one of the lower layer and the upper layer includes at least one of a semiconductor layer, a metal layer, or a two-dimensional material layer.

9. The layer structure of claim 8, wherein the semiconductor layer includes at least one of a Si layer, a Ge layer, an oxide semiconductor layer, or a Group III-V compound semiconductor layer.

10. The layer structure of claim 8, wherein the two-dimensional material layer includes at least one of a transition metal dichalcogenide layer, a quantum dot layer, or a carbon-based material layer.

11. The layer structure of claim 1, wherein the third layer is the ferroelectric and includes at least one of an HfO-based ferroelectric layer, a ZrO layer, or a perovskite layer.

12. The layer structure of claim 11, wherein the HfO-based ferroelectric layer includes at least one of an $HfO_2$ layer or a HfO layer doped with a dopant.

13. The layer structure of claim 12, wherein the dopant includes at least one of Si, Zr, Al, La, Y, Sr, Gd, or Mg.

14. The layer structure of claim 2, wherein the first layer and the fourth layer each include an $HfO_2$ layer.

15. The layer structure of claim 1, wherein the oxide layer includes at least one of YO, LaO, MgO, SrO, BaO, or SiO.

16. A method of manufacturing a dielectric layer, the method comprising:
    forming a first layer on a substrate;
    forming a second layer on the first layer, the second layer including an oxide; and
    forming a third layer on the second layer,
    wherein one of the first layer or the third layer is a ferroelectric, and a remainder of the first and third layers is an anti-ferroelectric wherein the oxide layer directly contacts the ferroelectric and the anti-ferroelectric, and wherein each of the first layer and the third layer is a single layer.

17. The method of claim 16, further comprising:
    forming a fourth layer on the third layer.

18. The method of claim 16, wherein a thickness of the second layer is 10% or less than a total thickness of the dielectric layer.

19. The method of claim 16, wherein the oxide has a band gap of 4 eV or more.

20. The method of claim 16, wherein the second layer includes at least one of YO, LaO, MgO, SrO, BaO or SiO.

21. The method of claim 16, wherein the substrate includes at least one of a metal layer, a Si layer, a Ge layer, an oxide semiconductor layer, a Group III-V compound semiconductor layer, a two-dimensional material layer, a transition metal dichalcogenide layer, a quantum dot layer, or a carbon-based material layer.

22. The method of claim 16, wherein the third layer is the ferroelectric and includes at least one of an $HfO_2$ layer, a ZrO layer, an HfO layer doped with a dopant, or a perovskite layer.

23. The method of claim 22, wherein the dopant includes at least one of Si, Zr, Al, La, Y, Sr, Gd, or Mg.

24. The method of claim 17, wherein the second layer is formed between the third layer and the fourth layer.

25. A transistor comprising:
    a first doped region;
    a second doped region separated from the first doped region; and
    a gate stack between the first and second doped regions, the gate stack comprising the dielectric layer of claim 1, and a gate electrode on the dielectric layer.

26. A memory device comprising:
    a transistor; and
    a data storage element connected to the transistor, wherein the data storage element comprises the layer structure of claim 1.

* * * * *